(12) United States Patent
Kim (10) Patent No.: US 7,659,048 B2
(45) Date of Patent: Feb. 9, 2010

(54) PRINTING RESIST, METHOD FOR PREPARING THE SAME AND PATTERNING METHOD USING THE SAME

(75) Inventor: Jin Wuk Kim, Uiwang-si (KR)

(73) Assignee: LG Display Co., Ltd., Seoul (KR)

( * ) Notice: Subject to any disclaimer, the term of this patent is extended or adjusted under 35 U.S.C. 154(b) by 60 days.

(21) Appl. No.: 11/808,418

(22) Filed: Jun. 8, 2007

(65) Prior Publication Data

US 2007/0287099 A1  Dec. 13, 2007

(30) Foreign Application Priority Data

Jun. 9, 2006  (KR) .................... 10-2006-0052043

(51) Int. Cl.
*G03F 7/26* (2006.01)
*G03C 1/00* (2006.01)
(52) U.S. Cl. .................... 430/270.1; 430/302
(58) Field of Classification Search ............... 430/270.1
See application file for complete search history.

(56) References Cited

U.S. PATENT DOCUMENTS

| 6,177,230 B1 * | 1/2001 | Kawamura ............... 430/270.1 |
| 2004/0102548 A1 * | 5/2004 | Suzuki ....................... 524/88 |
| 2004/0197704 A1 * | 10/2004 | Eilbeck ................... 430/270.1 |

OTHER PUBLICATIONS

Debmalya Roy, P K Bass and S V Eswaran, Photoresist for Microlithography, Resonance, Aug. 2002, pp. 59-66.*

\* cited by examiner

*Primary Examiner*—Cynthia H Kelly
*Assistant Examiner*—Chanceity N Robinson
(74) *Attorney, Agent, or Firm*—McKenna Long & Aldridge (57) ABSTRACT

Disclosed herein is a printing resist sequentially transferred to a printing plate and a substrate after being applied to a printing roll. The printing resist comprises at least one polymer main chain bound to a tackiness-inducing vinyl group. The surface of the printing resist has tackiness without complete dryness, thus enabling a correct transfer of the printing resist to the printing plate and substrate.

8 Claims, 5 Drawing Sheets

PRINTING RESIST, METHOD FOR PREPARING THE SAME AND PATTERNING METHOD USING THE SAME

This application claims the benefit of Korean Patent Application No. 2006-52043 filed on Jun. 9, 2006, which is hereby incorporated by reference for all purposes as if fully set forth herein.

BACKGROUND OF THE INVENTION

1. Field of the Invention

The present invention relates to a liquid crystal display (LCD) device, and more particularly, to a printing resist used as a patterning method of a liquid crystal display (LCD) device.

2. Discussion of the Related Art

In recent years, a variety of flat panel display devices have been developed that have an ultra-slim display screen with a thickness of several centimeters. In particular, liquid crystal display (LCD) devices are widely utilized in a variety of applications including notebook computers, monitors, spacecraft and aircraft, for example, owing to advantages such as low operation voltage, low power consumption and portability.

LCDs may include a first substrate and a second substrate, and a crystal liquid layer interposed between the first substrate and the second substrate.

The first substrate may include a plurality of gate lines and a plurality of data lines substantially perpendicular to the gate lines in order to define pixel regions. The first substrate may also include a plurality of thin film transistors (TFTs) each formed at a crossing between an associated one of the gate lines and an associated one of the data lines, and a plurality of pixel electrodes formed at respective pixel regions. Each pixel electrode is connected to an associated one of the thin film transistors.

The second substrate may also include a blocking layer for blocking light leakage from the gate lines, the data lines and the thin film transistors. The second substrate may also include color filter layers formed on the blocking layer and a common electrode formed on the color filter layers.

As mentioned above, the LCD device may include a variety of constituent components. Accordingly, the LCD device is produced through several processes. In particular, photolithography has been generally used to pattern each constituent component into various shapes.

FIGS. 1A to 1D are cross-sectional views schematically illustrating a related art photolithography process.

Figure 1A:
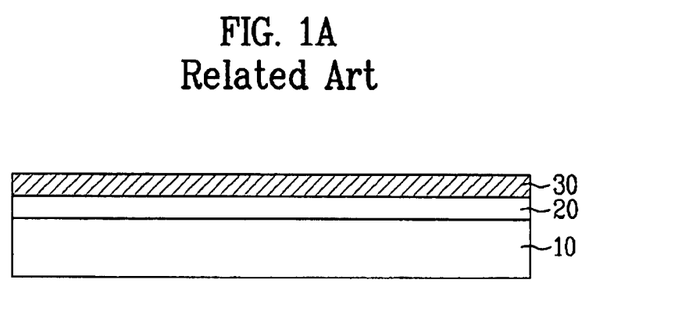
FIGS. 1A through and including 1D are cross-sectional views schematically illustrating a related art photolithography process.

As shown in FIG. 1A, a pattern layer 20 and a photoresist layer 30 are sequentially formed on a substrate 10.

Figure 1B:
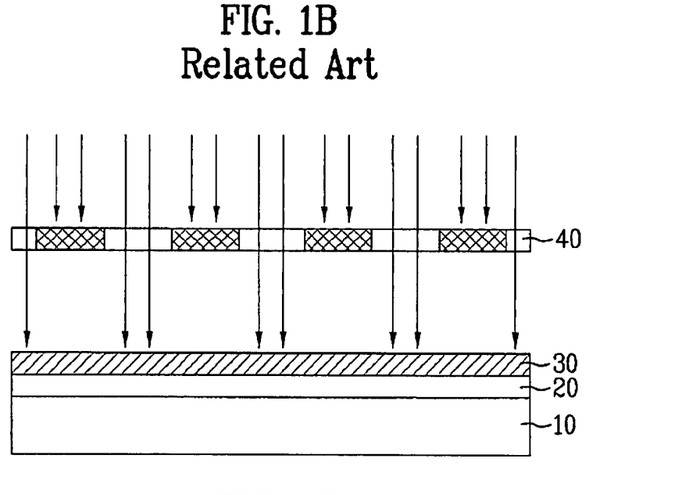

As shown in FIG. 1B, the photoresist layer 30 is subjected to light irradiation with a light irradiator through a mask 40 having a predetermined pattern.

Figure 1C:
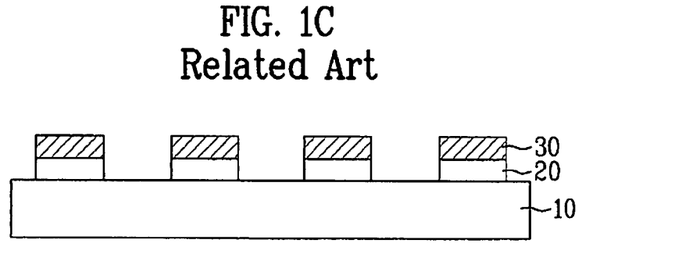

As shown in FIG. 1C, the pattern layer 20 and the photoresist layer 30 are patterned by developing and etching processes.

Figure 1D:
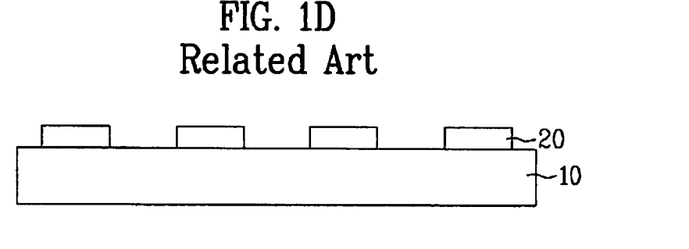

As shown in FIG. 1D, the photoresist layer 30 is removed with a photoresist stripper, to form a final photoresist pattern.

Photolithography necessarily involves a photomask having a predetermined pattern, that disadvantageously results in an increase in production costs. In addition, photolithography involves a developing process, which leads to complex production and consumes a lot of time.

Accordingly, there has been a demand to develop a novel patterning method that solves the disadvantages of photolithography. To satisfy such a demand, a patterning method using a printing roll was suggested.

FIGS. 2A to 2D are sectional views schematically illustrating a related art patterning method using a printing roll.

Figure 2A:
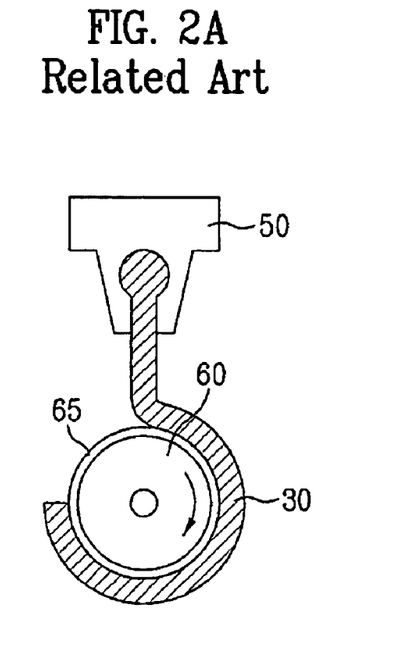
FIGS. 2A through and including 2D are sectional views schematically illustrating a related art patterning process using a printing roll.

As shown in FIG. 2A, a photoresist 30 is applied to a printing roll 60 equipped with a blanket 65 mounted on the surface thereof using a printing nozzle 50.

Since the blanket 65 mounted on the surface of the printing roll 60 is made of an elastic resin, it reduces the friction between the printing roll 60 and a printing plate (not shown), when the photoresist 30 applied to the printing roll 60 is transferred to the printing plate.

Figure 2B:
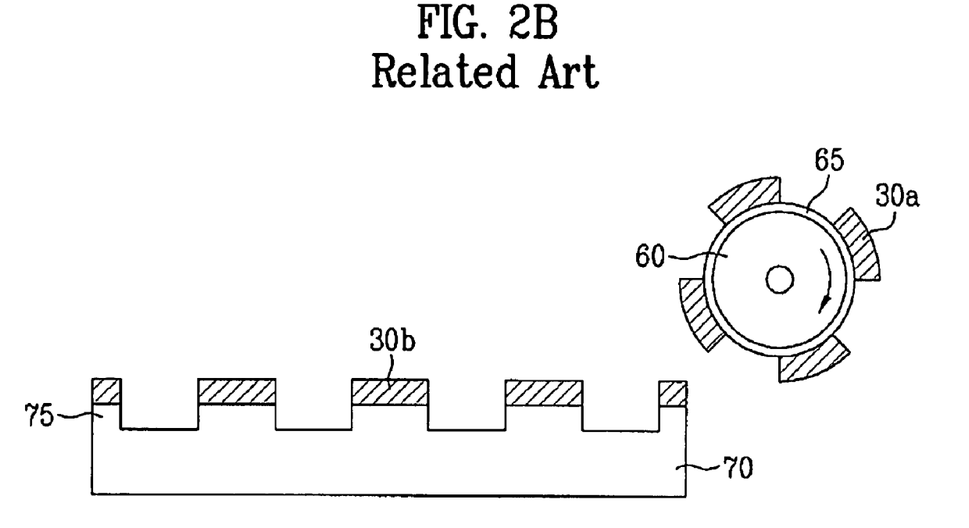

As shown in FIG. 2B, the printing roll 60 is rotated on the printing plate 70, where protrusions 75 are formed in a predetermined pattern, to transfer a partial photoresist 30b to the protrusions 75. As a result, the printing roll 60 is patterned by the remaining photoresist 30a.

Figure 2C:
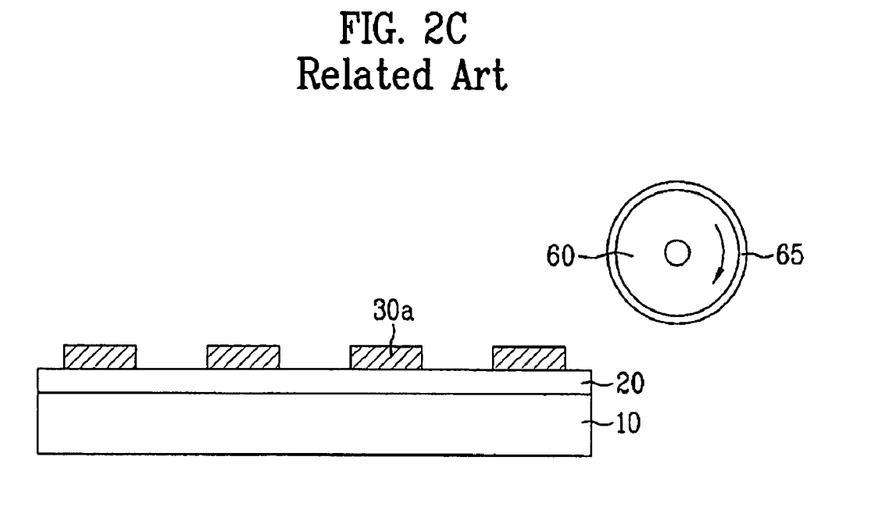

As shown in FIG. 2C, the printing roll 60 is rotated on a substrate 10 where a pattern layer 20 is formed, to transfer the photoresist 30a to the substrate 10.

Figure 2D:
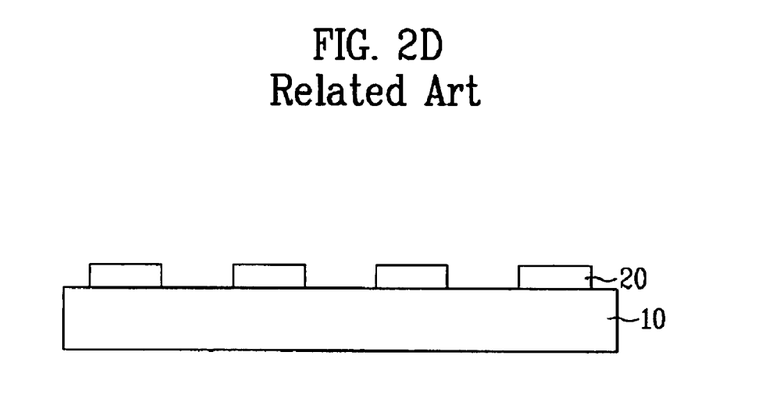

As shown in FIG. 2D, the pattern layer 20 is etched using the photoresist 30a as a mask, followed by removing using a photoresist stripper, to form a photoresist pattern.

The photoresist 30a is used as a mask for etching the pattern layer in a patterning method using a printing roll as well as photolithography.

Since the photoresist characteristics change upon the introduction of light, the photoresist is applicable to photolithography. However, when the photoresist is employed in the patterning method using a printing roll, the solvent constituting the photoresist may permeate into the blanket. As a result, the blanket is swelling, whereby pattern defects may occur, thus making it impossible to realize a desired pattern.

Accordingly, there is an increased need to develop a novel resist capable of being used as a substitute for the photoresist in a patterning method using a printing roll.

SUMMARY OF THE INVENTION

Accordingly, the present invention is directed to a printing resist, a method for preparing the same, and a patterning method using the same that substantially obviate one or more problems due to limitations and disadvantages of the related art.

One advantage of the present invention is to provide a printing resist capable of being correctly transferred to a printing plate and a substrate and thus realizing a desired pattern.

Another advantage of the present invention is to provide a patterning method using the printing resist.

Additional features and advantages of the invention will be set forth in the description which follows, and in part will become apparent from the description or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, a printing resist comprises: at least one polymer main chain bound to a tackiness-inducing vinyl group.

In another aspect, the present invention is directed to a printing resist which may use a copolymer whose main chains are bound to a tackiness-inducing vinyl group. For this reason, the surface of the printing resist may have a tackiness without dryness, thus being readily adhered to a printing plate and a substrate.

The printing resist may maintain its tackiness without complete dryness although a volatile solvent dissolving the printing resist evaporates. As a result, the printing resist can be desirably transferred to the printing plate and substrate.

The polymer main chain may be cresol.

The cresol may include at least one of meta-cresol and para-cresol.

The printing resist may further include a volatile solvent.

The volatile solvent may be methanol, ethanol, or iso-prophyl alcohol.

The printing resist may further comprise a surfactant, for example, semi-fluorinated surfactant.

In another aspect of the present invention, a method for preparing a printing resist comprises: mixing one selected from meta-cresol, para-cresol, meta-cresol bound to a vinyl group, and para-cresol bound to a vinyl group, with one selected from the meta-cresol bound to a vinyl group, and the para-cresol bound to a vinyl group; and subjecting the cresol mixture to copolymerization.

The meta-cresol bound to a vinyl group and the para-cresol bound to a vinyl group may be synthesized by reacting the meta-cresol and the para-cresol with butadiene, respectively.

The copolymerization may be carried out by reacting the cresol mixture with formaldehyde.

In yet another aspect of the present invention, a method for forming a pattern comprises: applying the printing resist according to the present invention to a printing roll having the surface equipped with a blanket; rotating the printing roll on the printing plate to partially transfer the printing resist to the printing plate; rotating the resulting printing roll on a substrate, where a pattern layer is formed, to transfer the remaining printing resist to the substrate; subjecting the substrate to heat-treatment; etching the pattern layer; and removing the printing resist from the substrate.

The heat-treatment may be carried out at about 150° C. or higher.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, the same reference numbers will be used throughout the drawings to refer to the same or like parts.

1. Printing Resist

First Embodiment

A printing resist according to a first embodiment of the present invention is represented by Formula 1 below:

(1)

wherein $1 \leq k1 \leq 10$ and $0 \leq m1 \leq 10$.

As can be seen from Formula 1, the printing resist according to the first embodiment comprises meta-cresol (m-$CH_3C_6H_4OH$) bound to a vinyl group ($CH_2\!=\!CH\!-\!$), more specifically, a copolymer of 4-(but-3-enyl)-3-methylphenol and meta-cresol.

In Formula 1, k1 and m1 are the number of 4-(but-3-enyl)-3-methylphenol and meta-cresol present in each unit copolymer, respectively. K1 and m1 values represent the ratio of 4-(but-3-enyl)-3-methylphenol and meta-cresol. In Formula 1, k1 is an integer from 1 to 10, and m1 is an integer from 0 to 10. For example, when k1 is 1 and m1 is zero, the printing resist is represented by Formula 2 below:

(2)

For example, when both k1 and m1 are 1, that is, the ratio of 4-(but-3-enyl)-3-methylphenol and meta-cresol is 1:1, the printing resist is represented by Formula 3 below:

(3)

In the case where the printing resist comprises exclusively 4-(but-3-enyl)-3-methylphenol (Formula 2), all main chains of the printing resist have a vinyl group. On the other hand, in the case where the printing resist comprises 4-(but-3-enyl)-3-methylphenol and meta-cresol in a ratio of 1:1 (Formula 3), 50% of the main chains of the printing resist have a vinyl group.

4-(but-3-enyl)-3-methylphenol and meta-cresol need not necessarily be alternatively arranged. That is, the arrangement of 4-(but-3-enyl)-3-methylphenol and meta-cresol is varied in each unit copolymer.

As the number of main chains having a vinyl group increases, the tackiness of the printing resist increases. Accordingly, by control of the ratio of 4-(but-3-enyl)-3-methylphenol and meta-cresol, the tackiness can be adjusted to a desired level depending on the type of the printing plate used.

Although the structure of a printing resist where 4-(but-3-enyl)-3-methylphenol is bounded to meta-cresol is illustrated in Formula 1, in a case where para-cresol is used instead of meta-cresol, the desired effects comparable to the meta-cresol can be achieved.

The printing resist, where 4-(but-3-enyl)-3-methylphenol is bounded to para-cresol, is represented by Formula 4 below:

(4)

wherein $1 \leq k5 \leq 10$ and $0 \leq m5 \leq 10$.

The definition and range of k5 and m5 in Formula 4 are the same as those of k1 and m1 in Formula 1, respectively.

The printing resist according to an embodiment of the present invention may further comprise a volatile solvent and a surfactant, in addition to the cresol bound to a vinyl group.

Any volatile solvent may be used in the present invention without particular limitation, so long as it is capable of favorably dissolving a printing resist made of the cresol bounded to a vinyl group upon applying the printing resist to a printing roll, while it causes no deterioration of the performance of the blanket mounted on the surface of the printing roll.

Preferred is the use of a volatile solvent having a low boiling point, preferably, about 100° C. or lower. This is the reason that the volatile solvent must be evaporated immediately after the printing resist is applied to a printing roll. Solvents capable of satisfying all of the noted requirements may include methanol, ethanol and iso-prophyl alcohol, for example.

Since a surfactant may be used to secure spreadability of the printing resist which is applied to a printing roll, it necessarily has superior compatibility with the blanket mounted on the surface of the printing roll. When taking into consideration the fact that the blanket is mainly made of polydimethyl siloxane (PDMS) and is superhydrophobic, a semi-fluorinated surfactant is preferred.

Examples of suitable surfactant include $CF_3(CF_2)_4(CH_2CH_2O)_{10}$ and $CF_3(CF_2)_5(CH_2CH_2O)_{14}$. The printing resist comprises about 75% or more by weight of the volatile solvent, about 20% or less by weight of the cresol with a vinyl group, and about 5% or less by weight of the surfactant.

Second Embodiment

A printing resist according to a second embodiment of the present invention is represented by Formula 5 below:

(5)

wherein $1 \leq k2 \leq 10$, $0 \leq m2 \leq 10$

As can be seen from Formula 5, the printing resist according to the second embodiment comprises para-cresol (p-$CH_3C_6H_4OH$) bound to a vinyl group ($CH_2$=CH—), more specifically, a copolymer of 3-(but-3-enyl)-4-methylphenol and para-cresol.

In Formula 5, k2 and m2 are the number of 3-(but-3-enyl)-4-methylphenol and para-cresol present in each unit copolymer, respectively. The values of k2 and m2 represent the ratio of 3-(but-3-enyl)-4-methylphenol and para-cresol. In formula 5, k2 is an integer from 1 to 10, and m2 is an integer from 0 to 10. For example, when k2 is 1 and m2 is zero, the printing resist is represented by Formula 6 below:

(6)

For example, when both k2 and m2 are 1, that is, the ratio of 3-(but-3-enyl)-4-methylphenol and para-cresol is 1:1, the printing resist is represented by Formula 7 below:

(7)

In the case where the printing resist comprises exclusively 3-(but-3-enyl)-4-methylphenol (Formula 6), all main chains of the printing resist have a vinyl group. On the other hand, in the case where the printing resist comprises 3-(but-3-enyl)-4-methylphenol and para-cresol in a ratio of 1:1 (Formula 7), 50% of the main chains of the printing resist have a vinyl group.

Similarly, as in the first embodiment, by controlling the ratio of 3-(but-3-enyl)-4-methylphenol and para-cresol, the tackiness can be adjusted to a desired level depending on the type of the printing plate used, and the arrangement of 3-(but-3-enyl)-4-methylphenol and para-cresol may be varied in each unit copolymer.

Although the structure of a printing resist where 3-(but-3-enyl)-4-methylphenol is bounded to para-cresol is illustrated in Formula 5, in a case where meta-cresol is used instead of the para-cresol, the desired effects comparable to the para-cresol can be achieved.

Preferably, the printing resist, where 3-(but-3-enyl)-4-methylphenol is bounded to meta-cresol, is represented by Formula 8 below:

(8)

wherein $1 \leq k4 \leq 10$ and $0 \leq m4 \leq 10$.

The definition and range of k4 and m4 in Formula 8 are the same as those of k2 and m2 in Formula 5, respectively.

Similar to the first embodiment, the printing resist according to the second embodiment of the present invention may further comprise a volatile solvent and a surfactant, in addition to the cresol bound to a vinyl group.

Third Embodiment

A printing resist according to a third embodiment of the present invention is represented by Formula 9 below:

(9)

wherein $1 \leq k3 \leq 10$ and $1 \leq m3 \leq 10$.

As can be seen from Formula 9, the printing resist according to the third embodiment comprises meta-cresol bound to a vinyl group ($CH_2=CH-$), more specifically, a copolymer of 4-(but-3-enyl)-3-methylphenol and para-cresol bound to a vinyl group ($CH_2=CH-$), still more specifically, a copolymer of 4-(but-3-enyl)-3-methylphenol and 3-(but-3-enyl)-4-methylphenol.

In Formula 9, k3 and m3 are the number of 4-(but-3-enyl)-3-methylphenol and 3-(but-3-enyl)-4-methylphenol present in each unit copolymer, respectively. The values of k3 and m3 represent the ratio of 4-(but-3-enyl)-3-methylphenol and 3-(but-3-enyl)-4-methylphenol. In formula 9, k3 is an integer from 1 to 10, and m2 is an integer from 1 to 10.

For example, when both k2 and m2 are 1, that is, the ratio of 4-(but-3-enyl)-3-methylphenol and 3-(but-3-enyl)-4-methylphenol is 1:1, the printing resist is represented by Formula 10 below:

(10)

As shown in Formula 10, in the case where the printing resist comprises 4-(but-3-enyl)-3-methylphenol and 3-(but-3-enyl)-4-methylphenol, all main chains of the printing resist have a vinyl group.

Similarly, in the afore-mentioned embodiments, 4-(but-3-enyl)-3-methylphenol and 3-(but-3-enyl)-4-methylphenol need not necessarily be alternatively arranged.

Similar to the afore-mentioned embodiments, the printing resist according to the third embodiment of the present invention may further comprise a volatile solvent and a surfactant.

2. Preparation of Printing Resist

Hereinafter, a method for preparing the printing resist according to one embodiment of the present invention will be illustrated.

First, meta-cresol or para-cresol is reacted with butadiene, as represented by Reaction Schemes 1 and 2 below:

Reaction Scheme 1

As shown in Reaction Scheme 1, meta-cresol (m-CH$_3$C$_6$H$_4$OH) is reacted with butadiene (C$_4$H$_6$) to form 4-(but-3-enyl)-3-methylphenol.

Reaction Scheme 2

As shown in Reaction Scheme 2, para-cresol (p-CH$_3$C$_6$H$_4$OH) is reacted with butadiene (C$_4$H$_6$) to form 3-(but-3-enyl)-4-methylphenol.

Then, one selected from meta-cresol and para-cresol is mixed with one selected from 4-(but-3-enyl)-3-methylphenol and 3-(but-3-enyl)-4-methylphenol. The mixture is reacted with formaldehyde to prepare a copolymer.

The mixed ratio may be varied depending on the materials of the printing plate and blanket used.

When the amount of 4-(but-3-enyl)-3-methylphenol or 3-(but-3-enyl)-4-methylphenol is larger than that of meta- or para-cresol which contains no vinyl group, a printing resist prepared from the mixture has a relatively strong tackiness due to an increase in the number of the vinyl group bounded to the main chains thereof. On the other hand, when the amount of 4-(but-3-enyl)-3-methylphenol or 3-(but-3-enyl)-4-methylphenol is smaller than that of meta- or para-cresol which contains no vinyl group, a printing resist prepared from the mixture has a weak tackiness.

3. Patterning Method Using Printing Resist

FIGS. 3A to 3F are sectional views schematically illustrating a patterning method using a printing roll according to the present invention.

Figure 3A:
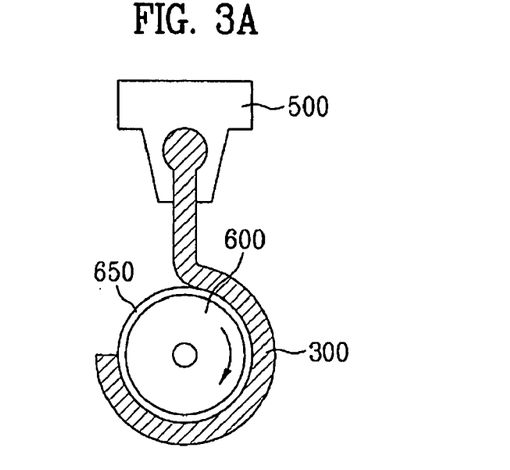
FIGS. 3A through and including 3F are sectional views schematically illustrating a patterning method using a printing roll according to the present invention.

As shown in FIG. 3A, a printing resist 300 is applied to a printing roll 600 equipped with a blanket 650 mounted on the surface thereof using a printing nozzle 500.

Figure 3B:
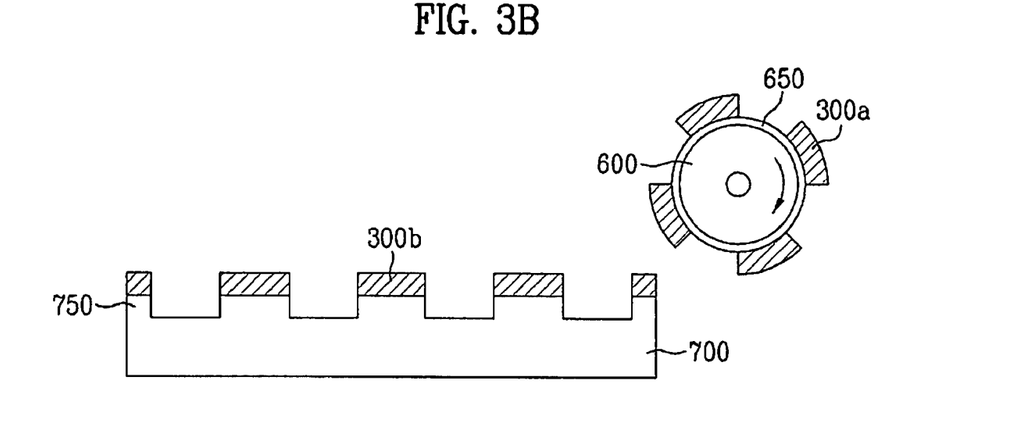

As shown in FIG. 3B, the printing roll 600 is rotated on the printing plate 700, where protrusions 750 are formed in a predetermined pattern, to transfer a partial printing resist 300b to the protrusions 750. As a result, the printing roll 600 is patterned by the remaining printing resist 300a.

Figure 3C:
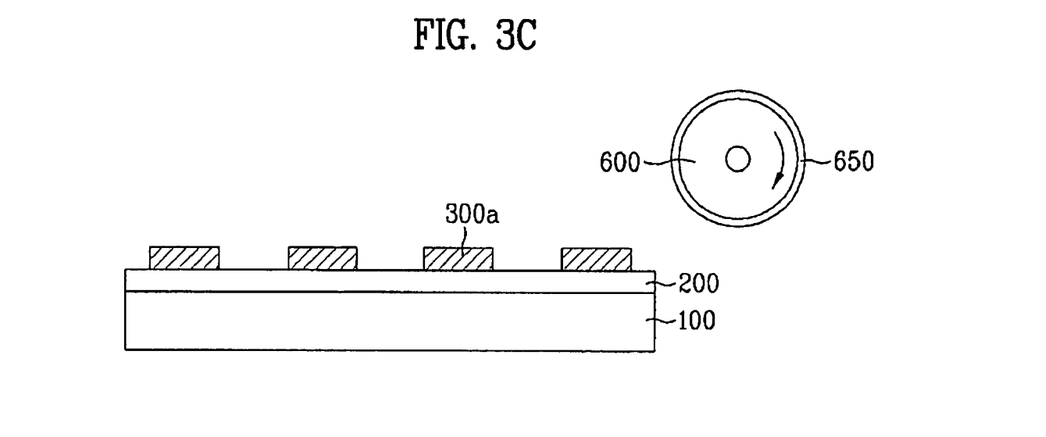

As shown in FIG. 3C, the printing roll 600 is rotated on a substrate 100 where a pattern layer 200 is formed, to transfer the printing resist 300a to the substrate 100.

Figure 3D:
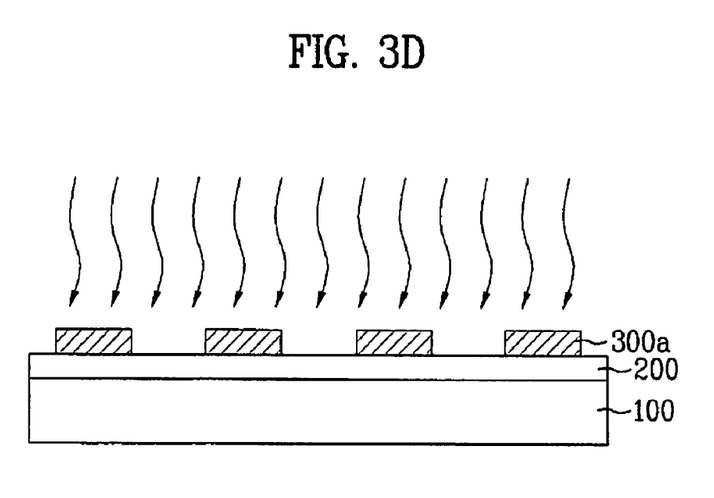

As shown in FIG. 3D, the resulting substrate 100 is subjected to heating. As a result, the double bond of the vinyl group, which is bound to the main chain of the printing resist 300a, is broken, thus the printing resist 300a loses its tackiness. The heating is preferably carried out at 150° C. or higher.

Figure 3E:
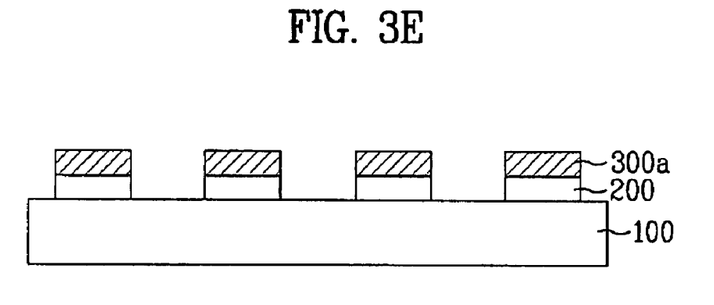

As shown in FIG. 3E, the pattern layer 200 is etched using the printing resist 300a as a mask.

Figure 3F:
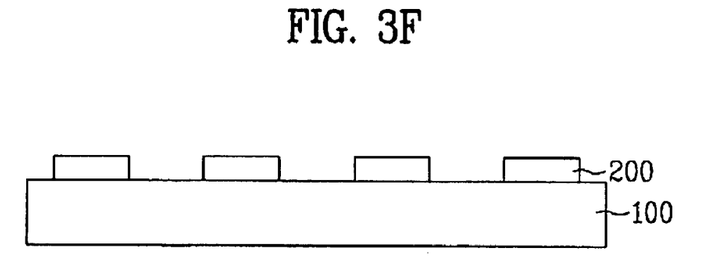

As shown in FIG. 3F, the printing resist 300a is removed using a printing resist stripper, to form a pattern.

As apparent from the foregoing, according to the present invention, since the printing resist has a polymer main chain bound to a vinyl group, the surface of the printing resist maintains its tackiness without dryness although a volatile solvent evaporates. As a result, the printing resist can be desirably transferred to the printing plate and substrate, and thus a high-quality pattern can be formed.

In addition, the printing resist of the present invention does not affect a blanket mounted on the surface of the printing roll, thus contributing to a reduction in replacement costs of the blanket.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A printing resist sequentially transferred to a printing plate and a substrate after applied to a printing roll, wherein the printing resist comprises at least one polymer main chain bound to a tackiness-inducing vinyl group, and wherein the polymer main chain is cresol;

wherein the cresol is meta-cresol, wherein a printing resist comprising the meta-cresol as the polymer main chain is represented by formula 1 below:

(1)

wherein 1≦k1≦10 and 0≦m1≦10.

2. A printing resist sequentially transferred to a printing plate and a substrate after applied to a printing roll, wherein the printing resist comprises at least one polymer main chain bound to a tackiness-inducing vinyl group, and wherein the polymer main chain is cresol;

wherein the cresol is para-cresol, wherein a printing resist comprising the para-cresol as the polymer main chain is represented by formula 2 below:

(2)

wherein $1 \leq k2 \leq 10$ and $0 \leq m2 \leq 10$.

3. A printing resist sequentially transferred to a printing plate and a substrate after applied to a printing roll, wherein the printing resist comprises at least one polymer main chain bound to a tackiness-inducing vinyl group, and wherein the polymer main chain is cresol;

wherein the cresol is meta-cresol and para-cresol, wherein a printing resist comprising the meta-cresol and the para-cresol as the polymer main chains is represented by formulae 3 to 5 below:

(3)

wherein $1 \leq k3 \leq 10$ and $1 \leq m3 \leq 10$;

(4)

wherein $1 \leq k4 \leq 10$ and $1 \leq m4 \leq 10$ and (5)

wherein $1 \leq k5 \leq 10$ and $1 \leq m5 \leq 10$.

4. The printing resist according to claim 1, further comprising a volatile solvent.

5. The printing resist according to claim 4, wherein the volatile solvent is methanol, ethanol, or iso-prophyl alcohol.

6. The printing resist according to claim 1, further comprising a surfactant.

7. The printing resist according to claim 6, wherein the surfactant is a semi-fluorinated surfactant.

8. The printing resist according to claim 7, wherein the semi-fluorinated surfactant is $CF_3(CF_2)_4(CH_2CH_2O)_{10}$, or $CF_3(CF_2)_5(CH_2CH_2O)_{14}$.

* * * * *